(12) United States Patent
Sakellariou et al.

(10) Patent No.: US 8,860,539 B2
(45) Date of Patent: Oct. 14, 2014

(54) MAGNETISED STRUCTURE INDUCING A HOMOGENEOUS FIELD, IN THE CENTRE THEREOF, WITH A PRE-DETERMINED ORIENTATION

(75) Inventors: Dimitrios Sakellariou, Boulogne Billancourt (FR); Cédric Hugon, Clamart (FR); Guy Aubert, Poitiers (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 591 days.

(21) Appl. No.: 13/063,875

(22) PCT Filed: Aug. 27, 2010

(86) PCT No.: PCT/FR2010/051784
§ 371 (c)(1),
(2), (4) Date: Aug. 17, 2011

(87) PCT Pub. No.: WO2011/023913
PCT Pub. Date: Mar. 3, 2011

(65) Prior Publication Data
US 2012/0013338 A1      Jan. 19, 2012

(30) Foreign Application Priority Data

Aug. 28, 2009 (FR) .................................... 09 55892

(51) Int. Cl.
| *H01F 3/00* | (2006.01) |
|---|---|
| *H01F 7/00* | (2006.01) |
| *H01F 7/02* | (2006.01) |
| *G01R 33/30* | (2006.01) |
| *G01R 33/383* | (2006.01) |

(52) U.S. Cl.
CPC ............ *G01R 33/383* (2013.01); *G01R 33/307* (2013.01); *H01F 7/0278* (2013.01)
USPC ............................. 335/302; 335/296; 324/318

(58) Field of Classification Search
CPC ........ G01R 33/44; G01R 3/3833; H01F 7/02; H01F 7/021; H01F 7/0273

USPC ......... 335/210, 212, 216, 296–299, 302–306; 324/319–321

See application file for complete search history.

(56) References Cited

U.S. PATENT DOCUMENTS

| 2,960,649 A | 11/1960 | Bloch |
| 4,999,600 A | 3/1991 | Aubert |

(Continued)

FOREIGN PATENT DOCUMENTS

| WO | WO 88/10500 | 12/1988 |
| WO | WO 2006/024775 | 3/2006 |

(Continued)

*Primary Examiner* — Bernard Rojas
(74) *Attorney, Agent, or Firm* — Preti Flaherty Beliveau & Pachios LLP (57) ABSTRACT

A magnetized structure that induces in a central area of interest a homogeneous magnetic field of predetermined orientation relative to a longitudinal axis (z) of the structure comprises at least two magnetized rings (110, 120) disposed symmetrically relative to a plane (P) that is perpendicular to the longitudinal axis (z) and that contains the central area of interest, and at least one median annular magnetized structure disposed at least partly between the two magnetized rings (110, 120) and also disposed symmetrically relative to the plane (P) of symmetry, one of the two magnetized rings (110) being magnetized radially relative to the longitudinal axis (z) with divergent magnetization and the other of the two magnetized rings (120) being magnetized radially relative to the longitudinal axis (z) with convergent magnetization, and the median annular magnetized structure being magnetized with an orientation different from that of the magnetization of the two magnetized rings (110, 120). The median annular magnetized structure comprises at least one magnetized ring (150) having a magnetization distribution of orientation that varies as in Halbach dipoles and the first two magnetized rings (110, 120) and the median annular magnetized structure are each divided into individual components in the form of regularly distributed identical sectors.

25 Claims, 8 Drawing Sheets

(56) References Cited

U.S. PATENT DOCUMENTS

| | | |
|---|---|---|
| 5,014,032 A | 5/1991 | Aubert |
| 5,148,138 A | 9/1992 | Miyata |
| 5,332,971 A | 7/1994 | Aubert |
| 5,337,472 A * | 8/1994 | Leupold et al. ............... 29/607 |
| 5,428,333 A * | 6/1995 | Abele et al. .................. 335/306 |
| 5,523,732 A | 6/1996 | Leupold |
| 6,680,663 B1 * | 1/2004 | Lee et al. .................... 335/306 |
| 6,885,267 B2 * | 4/2005 | Kuriyama et al. ........... 335/306 |
| 7,760,059 B2 * | 7/2010 | Higuchi ....................... 335/306 |
| 2008/0296494 A1 * | 12/2008 | Heninger et al. ............ 250/292 |
| 2011/0291781 A1 * | 12/2011 | Sakellariou et al. ......... 335/296 |
| 2012/0098630 A1 * | 4/2012 | Sakellariou et al. ......... 335/302 |

FOREIGN PATENT DOCUMENTS

| | | |
|---|---|---|
| WO | WO 2006/047580 | 5/2006 |
| WO | WO 2007/120057 | 10/2007 |

* cited by examiner

MAGNETISED STRUCTURE INDUCING A HOMOGENEOUS FIELD, IN THE CENTRE THEREOF, WITH A PRE-DETERMINED ORIENTATION

FIELD OF THE INVENTION

The present invention relates to a magnetized structure applied to a nuclear magnetic resonance device that induces in a central area of interest a homogeneous magnetic field of predetermined orientation relative to a longitudinal axis of the structure, the structure comprising at least first and second magnetized rings disposed symmetrically relative to a plane that is perpendicular to said longitudinal axis and that contains said central area of interest and at least one median annular magnetized structure disposed at least partly between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized with an orientation different from that of the magnetization of the first and second magnetized rings.

PRIOR ART

In the field of nuclear magnetic resonance (NMR), the sample (object or patient) is placed inside a magnetic field that must be very intense and very homogeneous. It is therefore necessary to be able to manufacture magnetized structures capable of producing such magnetic fields.

Moreover, it is often useful to be able to produce a magnetic field in a predetermined direction. For example, in order to improve resolution, in the magic angle spinning (MAS) technique a sample is made to spin rapidly at a so-called magic angle (equal to 54 degrees 44 minutes) to the direction of the static magnetic field.

The magnets used at present in NMR to create intense and homogeneous fields are for the most part based on the flow of current in windings. Whether the windings are resistive or superconducting, it is always necessary to supply the magnet with current and also with cryogenic fluids for superconducting windings. Because of this, the devices are bulky and difficult to move. Resistive windings require high-current feeds, while superconducting windings imply the use of a cryostat filled with cryogenic liquids, which is difficult to move.

A structure based on permanent magnets makes it possible to circumvent those constraints because the material is magnetized once and for all and, if it is manipulated appropriately, retains its magnetization without exterior maintenance. Moreover, so-called permanent materials are limited in terms of remanence (the magnetization remaining in the material once magnetized) and generating high fields in large areas of use requires large quantities of material. Since the density of these materials is approximately 7.5 g·cm$^3$, these systems quickly become very heavy. It is therefore important to minimize the quantity of material for a given field.

The difficulty with magnetic systems using permanent materials for NMR lies in the requirement to combine intense fields with high homogeneity. The methods of producing materials such as NdFeB cannot guarantee perfect homogeneity of magnetization or perfect repetitivity. Also, although it is possible to calculate structures providing the required homogeneity, it is necessary to provide for the possibility of a posteriori adjustments for correcting imperfections of the material.

The overall shape of those magnetized structures is generally cylindrical, where the structure has at least axial symmetry. That makes it possible to circumvent numerous factors of inhomogeneity. The area of interest is then at the center of the cylinder and access to this area may be effected along the axis by opening up a hole in the cylinder, or from the side by splitting the cylinder in two.

In the past, very few structures based on permanent magnets have been proposed for generating a homogeneous longitudinal field at the center. This is because the NMR applications that require high homogeneity also require the devices to be either very large (in MRI where a human body must be placed inside the device), which implies an enormous quantity of material (several tons), or very intense (in NMR spectroscopy, which uses fields exceeding 10 teslas (T), at present up to 20 T), which is simply not feasible at present with permanent materials.

The earliest patent relating to a cylindrical permanent magnet structure generating a homogeneous longitudinal field suitable a priori for NMR is that of Guy Aubert dating from 1991 (U.S. Pat. No. 5,014,032). That proposes using rings of permanent material magnetized radially. The rings are magnetized towards the axis of symmetry on one side of the useful area and outwards on the other side of the useful area. The structure is symmetrical relative to the plane orthogonal to the axis of symmetry and containing the center of the useful area.

Nowadays there is renewed interest in structures based on permanent materials because they are very suited to portable or transportable low-field NMR applications. Moreover, new magnetic materials offer much higher remanence and coercivity, making possible induced fields sufficient for applications in NMR (hundreds of milliteslas (mT)). Finally, these materials lend themselves readily to rotation, which should make it possible to obtain an improvement in resolution, as in the method proposed by Bloch (U.S. Pat. No. 2,960,649), this time by spinning the field, not the sample.

In 2006 Heninger et al. proposed a structure for generating a longitudinal field in the context of an ion trap (patent application WO 2006/024775). That magnet makes possible homogeneity of one per thousand in a volume of 10 cubic centimeters (cm$^3$) with a field of 1 T. That structure therefore does not make possible homogeneity as required for NMR, but produces a field comparable in magnitude to that of certain medical imaging devices (1.5 T). Moreover, the proposed structure is not simple to manufacture.

Moreover, Halbach (K. Halbach, "Design of permanent multipole magnets with oriented rare earth cobalt material", Nuclear Instruments and Methods, vol. 169, pp. 1-10, 1980) has proposed cylindrical structures making it possible to create any multipole with perfect homogeneity, but only for a magnet that is theoretically of infinite length. The best known Halbach multipole is the dipole, which generates an arbitrarily intense field transverse to the axis of the cylinder by increasing the ratio of the outside radius to the inside radius (this is limited by the coercivity of the material used). The Halbach structure is exact in two dimensions (implying that the structure is of infinite size in the third dimension) and requires continuous variation of the orientation of the magnetization in the material. These two conditions cannot be achieved in practice. In contrast, the orientation of the magnetization may be divided into discrete sectors. With a 2D structure, using a sufficient number of sectors makes it possible to obtain homogeneity to an arbitrarily chosen order. The three-dimensional aspect of the structure then makes it necessary to take account of edge effects and implies modification of the geometry to obtain the required homogeneity. This has given rise to diverse applications.

Those applications include the work of Callaghan et al., who have proposed a method of producing Halbach structures from cubic magnets (patent application WO 2007/120057). The resulting structure makes it possible to eliminate the second order terms, which rules out sufficient homogeneity for use in NMR.

Miyata (U.S. Pat. No. 5,148,138) has also proposed a method of producing homogeneous Halbach structures for NMR. U.S. Pat. No. 5,148,138 relates essentially to the use of ferrite and rare earths to optimize the weight and cost of the magnet.

Holsinger (patent application WO 88/10500) has also described an alternative production method using hollow rods to contain the magnetized material. The rods are disposed axisymmetrically and filled with pieces of permanent magnets magnetized in the right direction. The rods are segmented to adjust the homogeneity.

In addition to Halbach structures, Guy Aubert has proposed another type of structure creating a homogeneous transverse field (U.S. Pat. No. 4,999,600). That structure allows access to the center along the axis of symmetry. In U.S. Pat. No. 5,332,971, Aubert has subsequently proposed another type of structure offering a high homogeneity field at its center. That allows transverse access to the useful area. That structure uses two complementary sets of rings disposed on respective opposite sides of the useful area.

Finally, Leupold (U.S. Pat. No. 5,523,732) has drawn inspiration from the Halbach structure to propose a system allowing adjustment of the direction (in the transverse plane) and intensity of the field created at the center.

There has also been renewed interest in homogeneous structures based on permanent magnets in the context of rotating field NMR (R. D. Schlueter and T. F. Budinger, "Magic angle rotating field NMR/MRI magnet for in vivo monitoring of tissue", IEEE Transactions on Applied Superconductivity, vol. 18(2), p. 864-867, June 2008). That follows on from the discovery of the possibility of spinning at low speed (tens of hertz (Hz) as against tens of kilohertz (kHz) in standard sample rotation) to improve resolution (R. A. Wind, J. Z. Hu, and D. N. Rommereim, "High resolution $^1$H NMR spectroscopy in organs and tissues using slow magic angle spinning", Magnetic Resonance in Medicine, vol. 46, p. 213-218, 2001). That advance relates to obtaining the benefit of high-resolution spectra in samples that cannot be spun at the usual MAS speeds. With a human being in particular, it is inconceivable to rotate a person in the device. Also, rotating the field relative to the subject under study may prove particularly interesting by providing access to high resolution in anisotropic media without rotating the subject. Rotating field NMR exploration does not require extremely intense fields. In contrast, it is necessary to face up to the technological challenge of rotating the device generating the field at between 1 Hz and 10 Hz. In this regard permanent materials are the most appropriate because they do not require feeding with electricity or cryogenic liquids.

Until now, no permanent magnet structure has been proposed to enable the generation of an arbitrarily homogeneous field at an arbitrary angle to the axis of the structure. The solutions that have found applications have essentially consisted in interleaving a permanent magnet of the Halbach type generating a transverse field into an electromagnet generating a longitudinal field. The Halbach magnet is rotated inside the electromagnet, thereby rotating the field. It is of course necessary to decide beforehand the ratio $B_{electromagnet}/B_{Halbach}$ to obtain the required angle. There is at present no proposal for generating a homogeneous field at an arbitrary angle only from magnetized parts, especially since manipulating magnetized parts to assemble them proves difficult given all the forces linked to the magnetism of the parts, which may be extremely intense when assembling large parts.

DEFINITION AND OBJECT OF THE INVENTION

The present invention aims to remedy the drawbacks referred to above and in particular to offer a solution to the problem of assembling magnetized parts to form powerful permanent magnets capable of creating a homogeneous and intense field at the center of the magnetized structure, the induced field being oriented along the longitudinal axis of the structure.

The invention may find applications inter alia in the fields of "light" NMR or rotating field MRI-NMR.

Generally speaking, the present invention aims to make it possible to produce a magnetized structure inducing at its center an arbitrarily homogeneous field having a direction that may vary over the range 0 degrees (°) to 90° relative to the longitudinal axis of the structure.

The above objects are achieved in accordance with the invention by means of a magnetized structure applied to a nuclear magnetic resonance device that induces in a central area of interest a homogeneous magnetic field of predetermined orientation relative to a longitudinal axis of the structure, the structure comprising at least first and second magnetized rings disposed symmetrically relative to a plane that is perpendicular to said longitudinal axis and that contains said central area of interest, and at least one median annular magnetized structure disposed at least partly between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized with an orientation different from that of the magnetization of the first and second magnetized rings, the magnetized structure being characterized in that the median annular magnetized structure comprises at least one magnetized ring having a magnetization distribution of orientation that varies as in Halbach dipoles and in that the first and second magnetized rings and the median annular magnetized structure are each divided into individual components in the form of regularly distributed identical sectors.

In a first possible embodiment the first and second magnetized rings and the median annular magnetized structure constitute pure rings, each of which is divided into individual components in the form of regularly distributed identical sectors having the same magnetization distribution.

The first and second magnetized rings and the median annular magnetized structure may then optionally be contiguous along the longitudinal axis.

Contiguous sectors make it possible to have the best possible filling with magnetic material whereas non-contiguous sectors offer the possibility of fine adjustment.

In a preferred but non-limiting embodiment, there are at least twelve individual components in the form of regularly distributed identical sectors constituting a ring for each of the first and second magnetized rings and for the median annular magnetized structure in each ring.

According to another advantageous feature of the invention, the median annular structure between the first and second magnetized rings further comprises at least two magnetized rings symmetrical relative to said plane perpendicular to the longitudinal axis and having magnetization with an axial orientation parallel to said longitudinal axis in the positive direction of said longitudinal axis.

Additionally or instead, the median annular structure between the first and second magnetized rings similarly further comprises at least two magnetized rings symmetrical relative to said plane perpendicular to the longitudinal axis and having magnetization with an axial orientation antiparallel to said longitudinal axis.

According to a first possible embodiment of the invention all the individual components constituting a ring have a section consisting of a cylindrical ring sector.

According to another possible embodiment of the invention all the individual components constituting a ring have a section of trapezoidal shape.

According to a further possible embodiment of the invention all the individual components constituting a ring have a section of disk shape.

According to a second possible embodiment of the invention the first and second magnetized rings and the median annular magnetized structure constitute hybrid rings, each divided into individual components in the form of regularly distributed identical sectors, the individual components of the magnetized ring having a magnetization distribution of orientation that varies as in Halbach dipoles being at least in part interleaved with the individual components of the first and second magnetized rings.

Under such circumstances, in one possible embodiment the individual components forming hybrid magnetized rings symmetrical relative to said plane perpendicular to the longitudinal axis and having magnetization with axial orientation parallel or antiparallel to said longitudinal axis are interleaved with the individual components of the magnetized ring having a magnetization distribution of orientation that varies as in Halbach dipoles.

According to another possible particular feature the first and second magnetized rings constituting rings, each divided into individual components in the form of identical sectors that are not regularly distributed are divided into slices along the longitudinal axis, at least one of the slices situated the closest to said plane of symmetry perpendicular to said longitudinal axis being thinner than the other slices.

The individual components of the first and second magnetized rings are preferably interleaved in the azimuth direction alternately with the individual components of the magnetized ring having a magnetization distribution of orientation that varies as in Halbach dipoles.

In one possible particular application the assembly of the individual components of the first and second magnetized rings and of the median annular magnetized structure is adapted to create at the center of said central area of interest a homogeneous induced magnetic field that essentially points at the magic angle of 54.7° relative to said longitudinal axis.

BRIEF DESCRIPTION OF THE DRAWINGS

Other features and advantages of the invention emerge from the following description of particular embodiments given by way of example with reference to the appended drawings, in which:

FIGS. 8A to 12A are perspective views analogous to those of FIGS. 3 to 7 but relating to hybrid magnetized rings with sectors constituting angular sectors of a cylinder;

FIGS. 8B to 12B are perspective views analogous to those of FIGS. 8A to 12A but relating to hybrid magnetized rings with sectors of trapezoidal section;

FIGS. 8C to 12C are perspective views analogous to those of FIGS. 8B to 12B but relating to hybrid magnetized rings with sectors of cylindrical shape;

DETAILED DESCRIPTION OF PREFERRED EMBODIMENTS

Generally speaking, the present invention relates to a way of assembling magnetized parts in order to create a homogeneous and intense magnetic field at the center of a structure. The field induced at the center may have an arbitrary orientation relative to the axis of the structure. The orientation and homogeneity of the field are controlled by the number, disposition, and dimensions of the components subject to certain general rules that are discussed below. Such a structure is of particular benefit for NMR and MRI and in particular makes it possible to create a field pointing essentially at the so-called "magic" angle (arctan $\theta_m = \sqrt{2}$) to the axis of the magnetized structure.

The present invention makes it possible to produce a family of essentially cylindrical permanent magnets that produce an arbitrarily homogeneous magnetic field having a direction relative to the axis of the cylinder that may vary over the range 0° to 90°.

Figure 1:
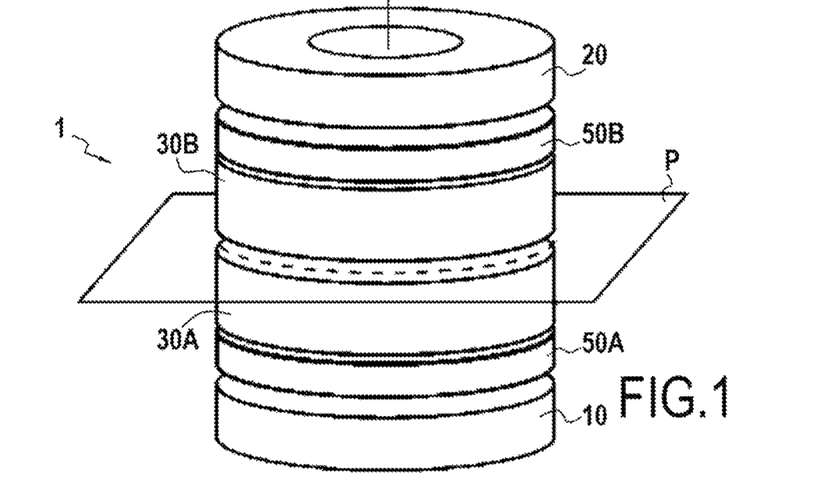
FIG. 1 is a diagrammatic overall perspective view of an axisymmetric magnetized structure of a first embodiment of the invention using a stack of pure magnetized rings.
Figure 2:
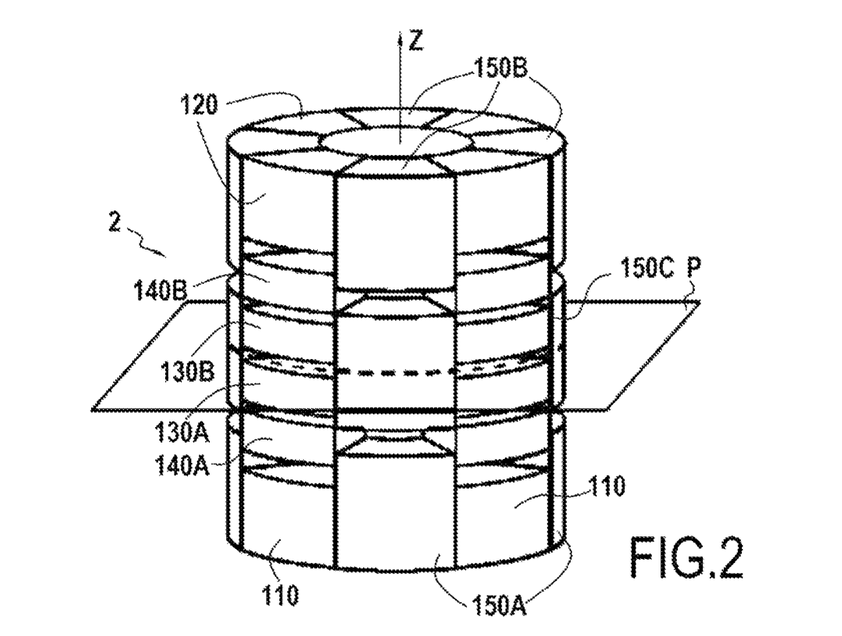
FIG. 2 is a diagrammatic overall perspective view of an axisymmetric magnetized structure of a second embodiment of the invention using a stack of hybrid magnetized rings.

The general structure comprises a stack of rings along the longitudinal axis $\underline{z}$ of the structure, as shown in FIGS. 1 and 2. In FIG. 1, the rings 10, 20, 30A, 30B, 50A, 50B constituting the axisymmetrically magnetized structure 1 have a continuous magnetization distribution like those shown in FIGS. 3 to 7. These rings are referred to as "pure" rings and correspond to ideal theoretical magnetization distributions in circular rings of rectangular axial section, which magnetization may be radial and divergent (ring 10 in FIG. 3), radial and convergent (ring 20 in FIG. 4), longitudinal and parallel to the axis $\underline{z}$ (ring 30 in FIG. 5), longitudinal and antiparallel to the axis $\underline{z}$ (ring 40 in FIG. 6) or of continuous variation of the Halbach dipole type (ring 50 in FIG. 7).

Figure 18:
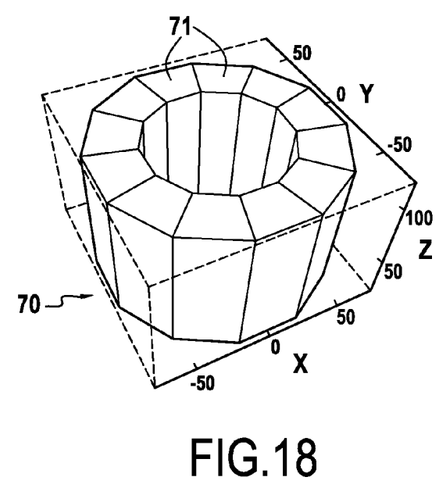
FIG. 18 is a perspective view of one embodiment of a pure magnetized ring comprising a set of contiguous sectors of trapezoidal section usable in a magnetized structure of the invention.
Figure 19:
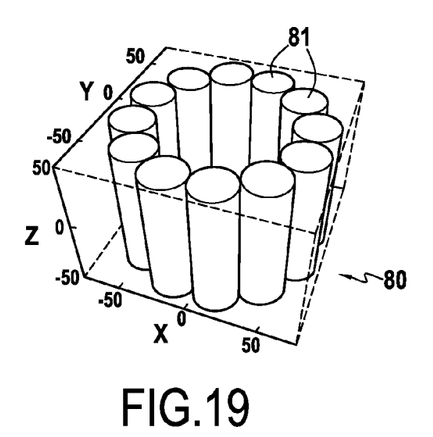
FIG. 19 is a perspective view of one embodiment of a pure magnetized ring comprising a set of contiguous sectors of cylindrical shape usable in a magnetized structure of the invention.

The rings 10, 20, 30, 40, 50 may be divided into elementary components that constitute angular sectors of a cylinder, but these rings may equally have a prismatic shape and a polygonal section. Generally speaking, a pure ring may consist of individual components in the form of regularly distributed identical sectors and the section of which perpendicular to the longitudinal axis $\underline{z}$ may have varied shapes (for example the shape of an isosceles trapezium like the elements 71 of the pure ring 70 represented in FIG. 18 or the circular shape of the components 81 of the pure ring 80 represented in FIG. 19, although other shapes are equally possible). These sectors are advantageously contiguous, but there may equally be small gaps between them allowing repositioning or adjustment of the sectors to optimize the uniformity of the field. The embodiments of FIGS. 18 and 19 show rings 70, 80 with contiguous sectors. These sectors have the important property of uniform magnetization within their volume, specifically to facilitate their production.

Note that the principal advantage of the cylindrical sectors is that for a structure of the Halbach type they are all identical, with the additional possibility of adjustment of the orientation of the magnetization in the final arrangement, which constitutes an important advantage of embodiments of the invention using cylindrical individual components. This simplifies the adjustments to obtain the required homogeneity.

Figure 13:
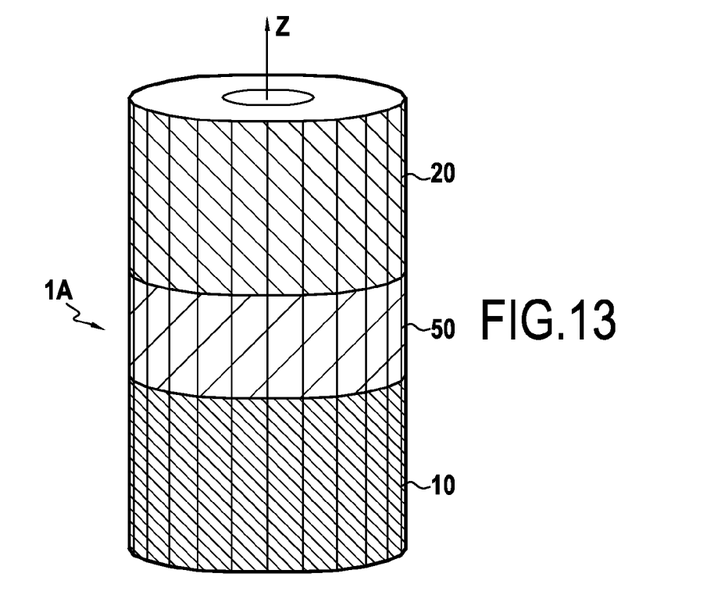
FIGS. 13, 14 and 15 are diagrammatic perspective views of three examples of axisymmetric or quasi-axisymmetric magnetized structures of the invention each of which comprises stacks of pure magnetized rings.
Figure 14:
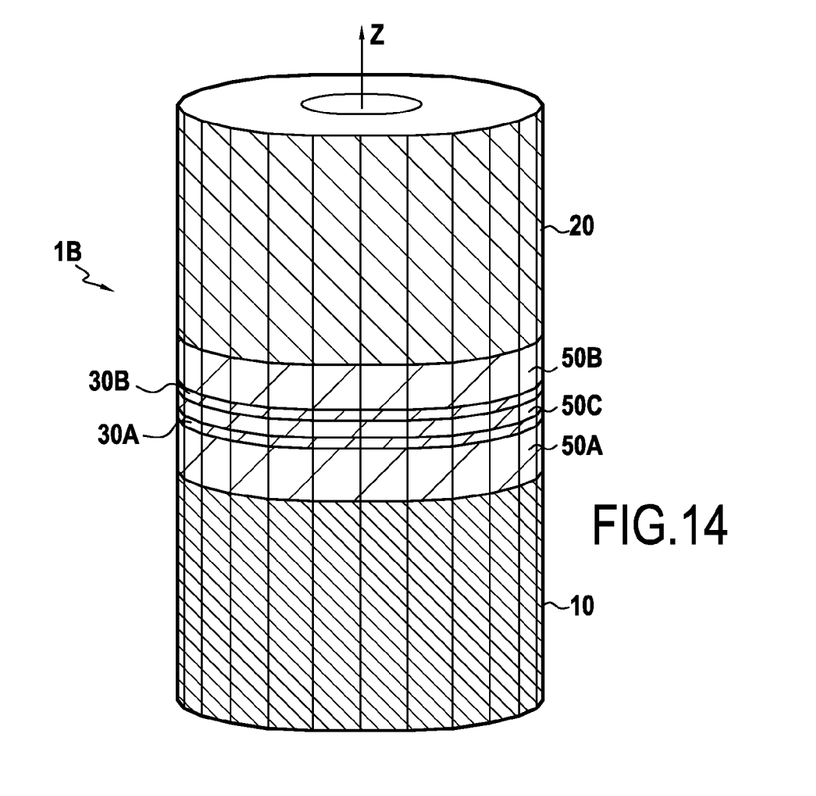
Figure 15:
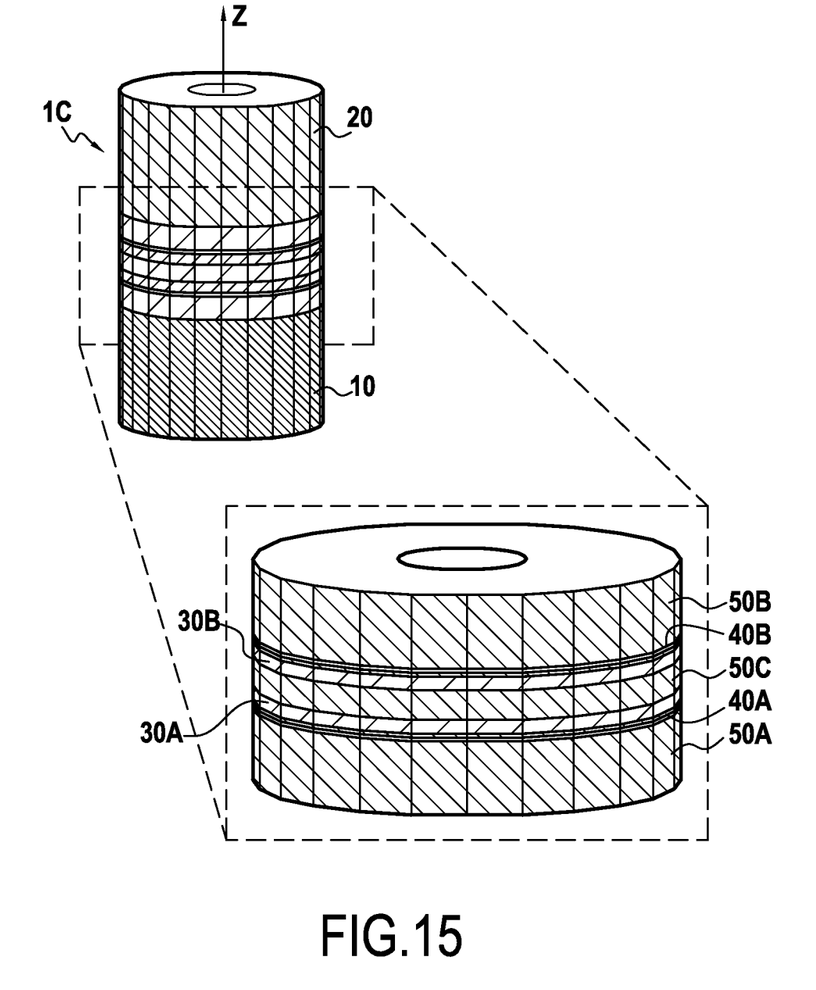

The FIG. 1 structure is symmetrical relative to a plane P perpendicular to the longitudinal axis $\underline{z}$. There is shown by way of example a stack comprising a ring 10 with divergent radial magnetization, a first ring 50A with continuously varying magnetization of the Halbach dipole type, a first ring 30A with longitudinal magnetization parallel to the axis $\underline{z}$, a second ring 30B with longitudinal magnetization parallel to the axis $\underline{z}$, a second ring 50B with continuously varying magnetization of the Halbach dipole type, and a ring 20 with convergent radial magnetization. Alternatively, a pair of rings symmetrical relative to the plane P and having longitudinal magnetization antiparallel to the axis $\underline{z}$ (like the ring 40 in FIG. 6) could equally be included in the FIG. 1 stack. In FIG. 1, for greater clarity, the different stack rings are non-contiguous, but in practice the magnetized rings 10 and 20 and all the magnetized rings 30A, 30B, 50A, 50B (and where applicable the magnetized rings 40) constituting a median annular magnetized structure are more generally contiguous along the longitudinal axis $\underline{z}$ (as represented in FIGS. 13 to 15 to be described below).

Because the production of the essentially axisymmetrical magnetized structure of the invention implies the assembly of sectors, in a second embodiment represented in FIG. 2 the quasi-axisymmetrical magnetized structure 2 is produced from hybrid magnetized rings that are constructed from sectors constituting portions of rings 10, 20, 30, 40, 50 represented in FIGS. 3 to 7.

Figure 3:
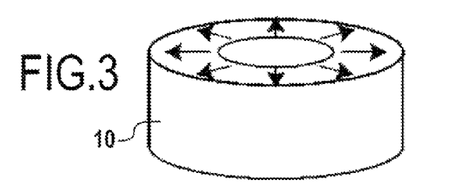
FIG. 3 shows the orientation of the magnetization in a divergent radial magnetization pure ring usable in a magnetized structure of the invention.
Figure 8A:
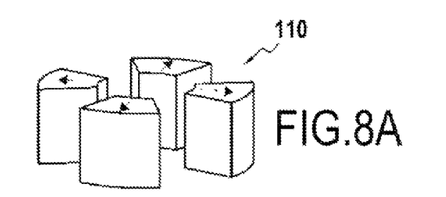
Figure 8B:
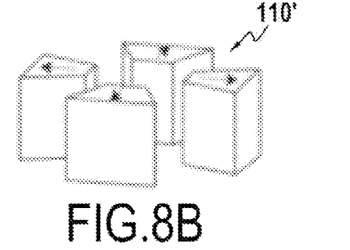
Figure 8C:
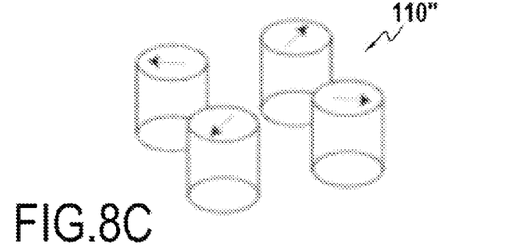

Thus FIGS. 8A, 8B, 8C show sets of individual sectors 110, 110', 110" that correspond to the (radially divergent) magnetization distribution of the ring 10 from FIG. 3.

Figure 4:
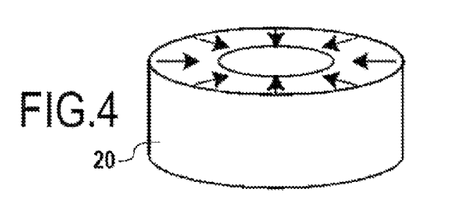
FIG. 4 shows the orientation of the magnetization in a convergent radial magnetization pure ring usable in a magnetized structure of the invention.
Figure 9A:
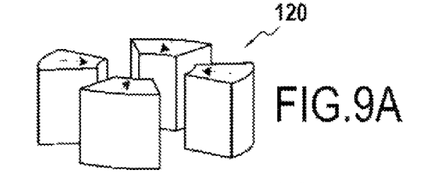
Figure 9B:
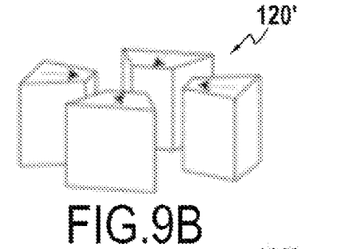
Figure 9C:
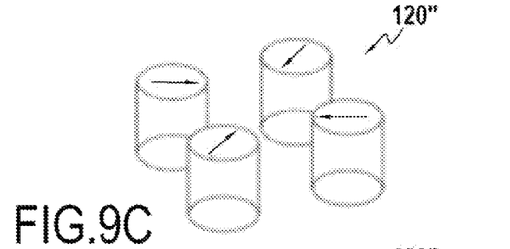

FIGS. 9A, 9B, 9C show sets of individual sectors 120, 120', 120" that correspond to the (radially convergent) magnetization distribution of the ring 20 from FIG. 4.

Figure 5:
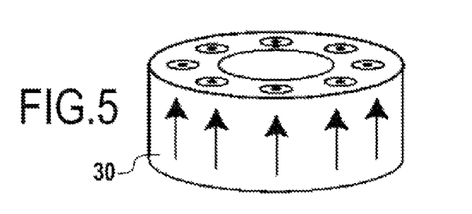
FIG. 5 shows the orientation of the magnetization in a pure ring with longitudinal magnetization parallel to the longitudinal axis usable in a magnetized structure of the invention.
Figure 10A:
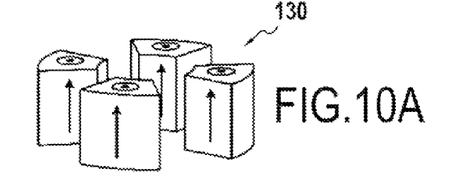
Figure 10B:
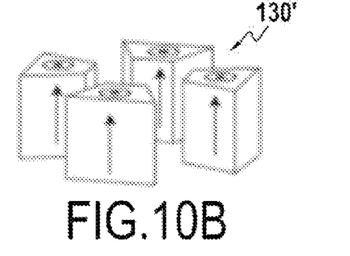
Figure 10C:
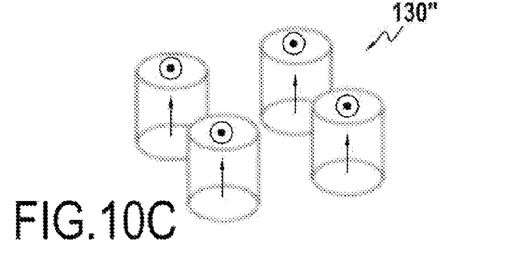

FIGS. 10A, 10B, 10C show sets of individual sectors 130, 130', 130" that correspond to the (longitudinal and parallel to the axis z) magnetization distribution of the ring 30 from FIG. 5.

Figure 6:
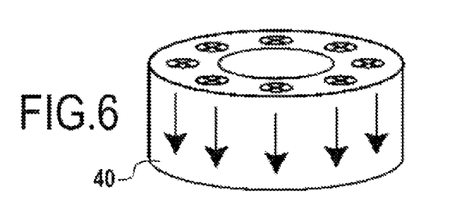
FIG. 6 shows the orientation of the magnetization in a pure ring with longitudinal magnetization antiparallel to the longitudinal axis usable in a magnetized structure of the invention.
Figure 11A:
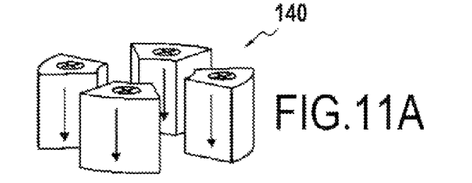
Figure 11B:
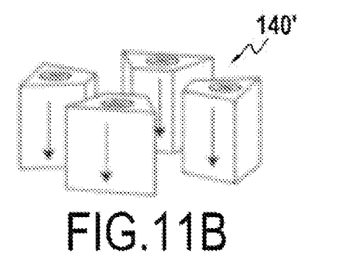
Figure 11C:
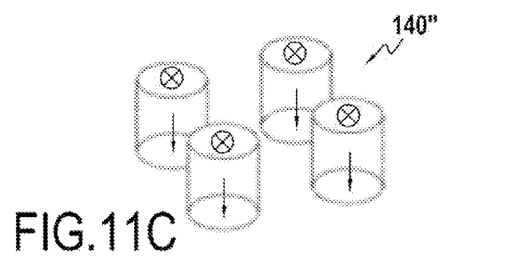

FIGS. 11A, 11B, 11C show sets of individual sectors 140, 140', 140" that correspond to the (longitudinal and antiparallel to the axis z) magnetization distribution of the ring 40 from FIG. 6.

Figure 7:
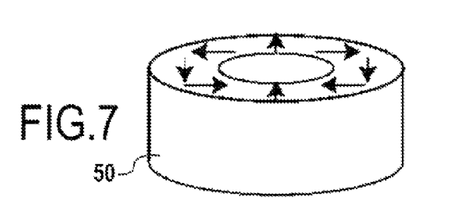
FIG. 7 shows the orientation of the magnetization in a pure ring of magnetization with orientation that varies as in Halbach dipoles usable in a magnetized structure of the invention.
Figure 12A:
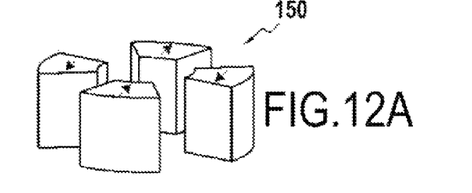
Figure 12B:
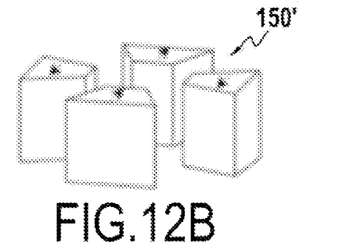
Figure 12C:
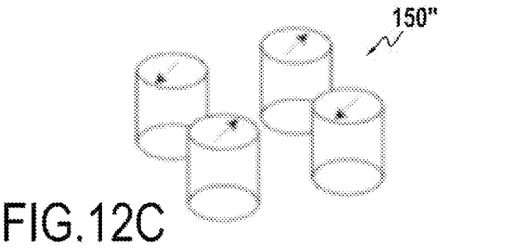

FIGS. 12A, 12B, 12C show sets of individual sectors 150, 150', 150" that correspond to the (continuous variation of the Halbach dipole type) magnetization distribution of the ring 50 from FIG. 7.

To construct a hybrid ring, sectors such as those shown in FIGS. 8A to 12A, 8B to 12B or 8C to 12C are interleaved alternately, i.e. alternate sectors have a different magnetization distribution.

Because the interleaved sectors correspond to different magnetization distributions, their thickness may also be different. This is readily seen in the final assembly 2 shown by way of example in FIG. 2 in which there is seen a first hybrid ring comprising sectors of a set 110 of divergent radial magnetization components from FIG. 8A alternating with sectors of a set 150A of Halbach magnetization components from FIG. 12A, then another hybrid ring comprising sectors of a set 140A of antiparallel longitudinal magnetization components from FIG. 11A that alternate with sectors of the set 150A of Halbach magnetization elements from FIG. 12A, then another hybrid ring comprising sectors from a set 130A of parallel longitudinal magnetization elements from FIG. 10A that alternate with sectors of another set 150C of elements with Halbach magnetization from FIG. 12A, then a further hybrid ring comprising sectors from another set 130B of parallel longitudinal magnetization components from FIG. 10A that alternate with sectors of the set 150C of Halbach magnetization elements from FIG. 12A, then another hybrid ring comprising sectors of a set 140B of antiparallel longitudinal magnetization components from FIG. 11A that alternate with sectors from the set 150C of Halbach magnetization components from FIG. 12A, then, finally, a last hybrid ring comprising sectors from a set 120 of convergent radial magnetization components from FIG. 9A that alternate with sectors of a set 150B of Halbach magnetization components from FIG. 12A.

The sectors to be interleaved are chosen so as to form two field components, independently and arbitrarily homogeneous at the center of the structure, of orientation that is essentially orthogonal. The amplitudes of the two fields are chosen to obtain a resultant field that points at a precise angle relative to the axis of the structure.

Figure 16:
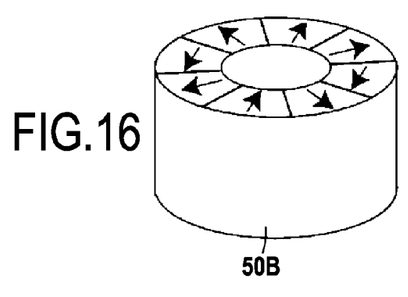
FIGS. 16 and 16A are perspective views from above of one embodiment of a hybrid ring comprising interleaved components of a magnetized structure of the Halbach type and a divergent radial magnetized structure both usable in a magnetized structure of the invention.
Figure 16A:
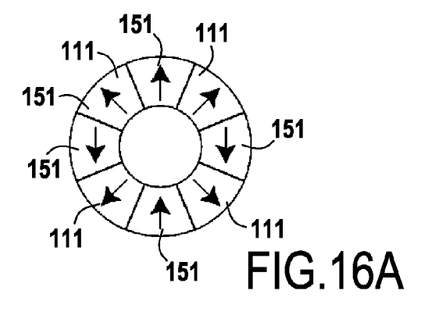

FIGS. 16 and 16A show by way of example a hybrid ring like that shown in FIG. 2 with an assembly 150B of Halbach magnetization sectors comprising individual sectors 151 of magnetization that corresponds to the Halbach dipole orientation and that alternate with individual sectors 111 of magnetization that is radially divergent.

Figure 17:
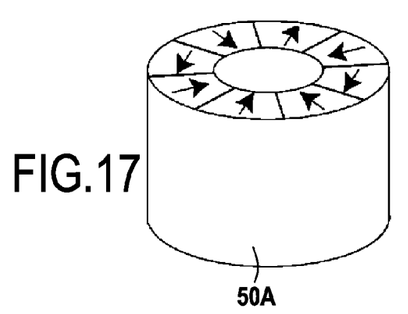
FIGS. 17 and 17A are perspective views from above of one embodiment of a hybrid ring comprising components of a magnetized structure of the Halbach type and a convergent radial magnetized structure both usable in a magnetized structure of the invention.
Figure 17A:
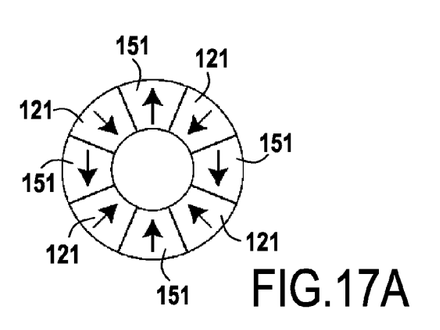

FIGS. 17 and 17A show by way of example a hybrid ring like that shown in FIG. 2 with an assembly 150A of Halbach magnetization sectors comprising individual sectors 151 of magnetization that corresponds to the Halbach dipole orientation and that alternate with individual sectors 121 of magnetization that is radially convergent.

Stacking the two hybrid rings of FIGS. 16 and 17 makes it possible to create a total field within the overall structure at a predetermined angle to the longitudinal axis $\underline{z}$.

Turning to FIGS. 1 and 2, there is seen in each figure a magnetized structure that is an assembly of annular cylindrical elements constituting permanent magnets. These annular elements are aligned along a common longitudinal axis $\underline{z}$ and are symmetrical relative to the plane P. The center of the region of interest where an intense and homogeneous field must be created is situated at the intersection of the axis $\underline{z}$ and the plane P. The overall structure is cylindrical with a central hole that extends along the axis $\underline{z}$ and allows access to the center of the region of interest.

The symmetry relative to the plane P makes it possible to cancel out all the odd terms in the regular solid spherical harmonic expansion of the component $B_z$ of the magnetic field produced in the vicinity of the center of the area of interest.

In the embodiment of FIGS. 18 and 19, the use of twelve sectors in each ring constitutes a preferred embodiment with a satisfactory order of homogeneity. A lower number of sectors, for example ten sectors or even fewer, also makes useful results possible, but with slightly degraded homogeneity. To improve homogeneity even further, each slice may be divided into more than twelve sectors.

A few basic concepts useful for understanding the invention are briefly described below.

Usually, the region of interest (RoI) is outside the region of the sources of magnetic field and a pseudo-scalar magnetic potential may be defined such that:

$$\vec{B} = -\vec{\nabla}\Phi^*$$

This potential satisfies the Laplace equation:

$$\Delta\Phi^* = 0$$

In the situation of interest here, the region of interest may be represented as a sphere of center that is referred to as the origin. The Laplace equation may be expressed in a system of spherical coordinates and a unique expansion of the potential into spherical harmonics may be obtained, centered at the origin. The general solution for the potential may then be written:

$$\Phi^*(r, \theta, \phi) = \sum_{l=0}^{\infty} \sum_{m=-l}^{l} [A_{lm} r^l + B_{lm} r^{-(l+1)}] Y_{lm}(\theta, \phi),$$

where:

$$Y_{lm}(\theta, \phi) = \sqrt{\frac{2l+1}{4\pi} \frac{(l-m)!}{(l+m)!}} P_l^m(\cos\theta)\exp(im\phi)$$

Remembering that the potential exists only in empty space, space may be divided into two areas in which the potential exists: inside the largest sphere centered at the origin that does not contain any source and outside the smallest sphere centered at the origin that contains all the sources.

If the sources are situated outside this sphere, the expansion may be written as follows:

$$\Phi^*(r, \theta, \phi) =$$
$$\frac{1}{\mu_0}\left\{Z_0 + \sum_{n=1}^{\infty} r^n \left[Z_n P_n(\cos\theta) + \sum_{m=1}^{n} (X_n^m \cos(m\phi) + Y_n^m \sin(m\phi)) P_n^m(\cos\theta)\right]\right\}$$

where the terms $Z_n$ are called the axial terms and the terms $X_n^m$ and $Y_n^m$ are called the non-axial terms.

Nevertheless, it is above all the field created by the structure that is of interest. The three components of the field in Cartesian coordinates satisfy the Laplace equation and may be expanded in the same manner as the potential.

In the context of the present invention, consider the components $B_x$ and $B_z$ of the magnetic flux density of the magnetic field along an axis $\underline{x}$ orthogonal to the longitudinal direction $\underline{z}$ and along that longitudinal axis $\underline{z}$, respectively:

$$B_x(r, \theta, \phi) =$$
$$Zx_0 + \sum_{n=1}^{\infty} r^n \left[Zx_n P_n(\cos\theta) + \sum_{m=1}^{n} (Xx_n^m \cos(m\phi) + Yx_n^m \sin(m\phi)) P_n^m(\cos\theta)\right]$$

$$B_z(r, \theta, \phi) =$$
$$Zz_0 + \sum_{n=1}^{\infty} r^n \left[Zz_n P_n(\cos\theta) + \sum_{m=1}^{n} (Xz_n^m \cos(m\phi) + Yz_n^m \sin(m\phi)) P_n^m(\cos\theta)\right]$$

with specific relationships between $Zx_n$, $Xx_n^m$, $Yx_n^m$, $Zz_n$, $Xz_n^m$, and $Z_n$, $X_n^m$, $Y_n^m$ derived from the potential. The result of this is that it is necessary to process the $\underline{x}$ and $\underline{z}$ components of the field separately.

For $B_z$, these relationships are simple: $Zz_n$, $Xz_n^m$, and $Yz_n^m$ are respectively proportional to $Z_{n+1}$, $X_{n+1}^m$, $Y_{n+1}^m$.

On the basis of the above equation, it may be concluded that in order to obtain a homogeneous field it is necessary to find a distribution of the source that creates a potential for which the expansion contains only the term $Z_1$ (provided the field is the derivative of the potential and that the term $Z_0$ for the field corresponds to the term $Z_1$ for the potential). Strictly speaking, this is impossible, but as many terms as necessary may be eliminated to obtain the required homogeneity with a given radius $\underline{r}$ since the field varies with $$\left(\frac{r}{a}\right)^n$$

where a is a constant characteristic of the geometry. In conclusion, to obtain the required homogeneity, it is necessary to eliminate the first k orders until $$\left(\frac{r}{a}\right)^{k+1}$$

is sufficiently small.

It may also be deduced from the above equation that an axisymmetrical structure is advantageous in that it eliminates the non-axial terms. To obtain homogeneity of order n, the n+1 symmetry of rotation guarantees that no non-axial term exists before order n.

Once the non-axial terms have been eliminated, the axial terms remain.

Another symmetry of interest is antisymmetry relative to the plane xOy that leaves only the odd axial terms in the potential and thus only the even axial terms in the field. Antisymmetry may also serve for the non-axial terms by allowing the use of a symmetry of rotation in n to obtain the order n. It is then possible to eliminate arbitrarily the orders 2p by providing p+1 independent sources.

For $B_x$, the relationship with the potential is less immediate:

$$Xx_n^1 + Z_{n+1} - \frac{(n+m+1)(n+m+2)}{2}X_{n+1}^2 \forall n \geq 1$$

$$Xx_n^m = \frac{1}{2}X_{n+1}^{m-1} - \frac{(n+m+1)(n+m+2)}{2}X_{n+1}^{m+1} \forall n \geq 2, 2 \leq m \leq n$$

$$Yx_n^1 = -\frac{(n+2)(n+3)}{2}Y_{n+1}^2 \forall n \geq 1$$

$$Yx_n^m = \frac{1}{2}Y_{n+1}^{m-1} - \frac{(n+m+1)(n+m+2)}{2}Y_{n+1}^{m+1} \forall n \geq 2, 2 \leq m \leq n$$

$$Zx_n = -\frac{(n+1)(n+2)}{2}X_{n+1}^1 \forall n \geq 0$$

In total, the cylindrical symmetry in n allows the elimination of the axial terms for $B_x$ and the elimination of most of the non-axial terms up to order n−1. Using p+1 sources allows the elimination of $Xx_n^1$ up to order p.

However, in a structure of the Halbach type, the potential distribution does not have symmetry of rotation in n, with the result that the non-axial terms of the potential are not eliminated automatically. Despite this lack of symmetry, the non-axial terms of $B_x$ are eliminated up to order n−2 for a structure of the Halbach type using n segments. Depending on the geometry, the first non-zero order may remain very low. The xOy symmetry eliminates each even term in the potential, with the result that there remain only even axial terms (because $Zx_n$ is proportional to $X_{n+1}^1$).

To summarize, a homogeneous transverse component of order 2p is obtained using structures of the Halbach type comprising 2p+2 segments and p+1 slices placed symmetrically about the plane xOy.

Starting from the analytical formulas of the expansion for the geometries of different sources, non-linear optimization may be used, which leads to a correct solution.

Moreover, the solution found may be expanded. The system may be expanded uniformly in all dimensions (constant scale factor) and made as large as possible, the homogeneity properties being unaffected and the amplitude of the magnetic field remaining constant.

Different possible embodiments of the present invention are described below by way of example.

The invention makes it possible to obtain a strong and highly homogeneous field that points essentially at the magic angle (~54.7°) to the axis of symmetry of the magnet, but this is not limiting on the invention, which applies to other situations in which the field is weaker or at a different angle.

The example of a magnet 1A with inclined field shown in FIG. 13 uses a stack of three pure rings 10, 50, and 20. The ring 20 has a radial magnetization distribution toward the hole in the magnet (see FIG. 4), the ring 10 has a radial magnetization distribution toward the exterior surface of the magnet (see FIG. 3), and the intermediate ring 50 has a magnetization distribution of orientation that varies as in Halbach dipoles (see FIG. 7). There is no gap along the axis z between the three components 10, 20, 50. The total field generated at the center of the magnet is ~0.989 $\mu_0 M$, where $\mu_0 M$ represents the magnetization of the magnetized parts and points at the magic angle.

The example of a magnet 1B with inclined field shown in FIG. 14 uses a stack of seven pure rings 10, 50A, 30A, 50C, 30B, 50B, and 20. The ring 20 has a radial magnetization distribution toward the central hole in the magnet (see FIG. 4) and the ring 10 has a radial magnetization distribution toward the exterior surface of the magnet (see FIG. 3). The rings 50A, 50C, 50B have a magnetization distribution of orientation that varies as in Halbach dipoles (see FIG. 7). The two rings 30A and 30B interleaved between the rings 50A, 50C, and 50B are symmetrical relative to a plane perpendicular to the longitudinal axis z and have an axial magnetization orientation parallel to the axis z (see FIG. 5). There is no gap along the axis z between the different rings constituting the magnet 1B. The field generated at the center of the magnet is ~0.889 $\mu_0 M$, where $\mu_0 M$ represents the magnetization of the magnetized parts. The magnet is homogeneous to the fourth order. The orientation of the field at the center of the magnet is at the magic angle with a deviation of less than 1/1000 in the region of interest.

The example of a magnet 1C with inclined field shown in FIG. 15 uses a stack of eleven pure rings 10, 50A, 40A, 30A, 50C, 30B, 40B, 50B. The ring 20 has a radial magnetization distribution toward the central hole in the magnet (see FIG. 4) and the ring 10 has a radial magnetization distribution toward the exterior surface of the magnet (see FIG. 3). The rings 50A, 50C, 50B have a magnetization distribution of orientation that varies as in Halbach dipoles (see FIG. 7). The two rings 30A, 30B have an axial magnetization orientation parallel to the axis z (see FIG. 5), while the components 40A, 40B have an axial magnetization orientation antiparallel to the axis z (see FIG. 6).

There is no gap along the axis z between the different rings of the stack and the total field generated at the center of the magnet ~0.862 $\mu_0 M$ where $\mu_0 M$ represents the magnetization of the magnetized parts. In the example shown in FIG. 15, the rings 40A, 30A and 40B, 30B respectively disposed between the rings 50A and 50C and the rings 50B and 50C are symmetrical relative to a plane perpendicular to the axis z. The rings 40A, 40B with antiparallel longitudinal magnetization are thinner than the rings 30A, 30B with parallel longitudinal magnetization, while the rings 30A, 30B are themselves thinner than the rings 50A, 50B, and the rings 50A, 50B are themselves thinner than the radial magnetization rings 10, 20. However, different configurations are possible with other configuration ring thicknesses. The magnet 1C is homogeneous to the sixth order. The orientation of the field at the center of the magnet is at the magic angle with a deviation of less than $\frac{1}{1000}$ in the region of interest.

Figure 22:
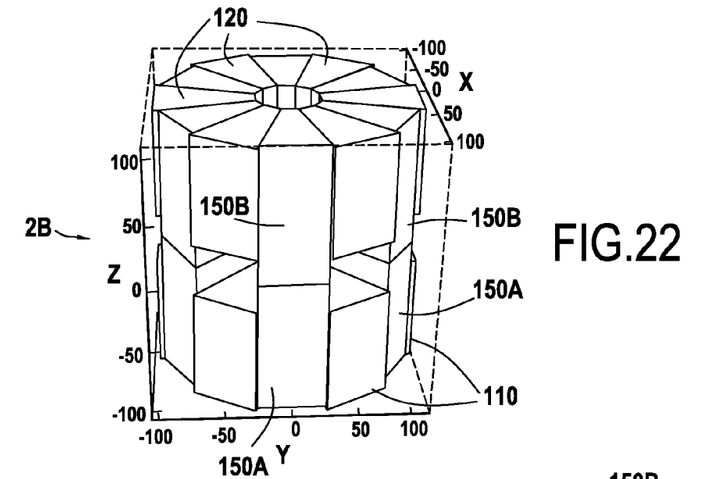
FIG. 22 is a perspective view of a magnetized structure of one embodiment of the invention comprising a stack of hybrid magnetized rings, each formed by sectors of trapezoidal section.

The example of a magnet 2B with inclined field shown in FIG. 22 uses two hybrid rings. The sectors of the set 120 have radial magnetization toward the central hole in the magnet (see FIG. 9B), the sectors of the set 110 have radial magnetization toward the exterior surface of the magnet (see FIG. 8B), and the sectors of the set 150A, 150B have magnetization of orientation that varies as in Halbach dipoles (see FIG. 12B). The sectors of the sets 110 and 120 are responsible for producing the longitudinal component of the magnetic field, while the sectors of the sets 150A, 150B are interleaved with the sectors of the sets 110 and 120, respectively, to form hybrid rings that produce the transverse component.

Note that a gap may be provided in the axial direction between the sectors of the set 110 and the sectors of the set 120, while the sectors of the sets 150A and 150B are contiguous along the axis $\underline{z}$, and the thickness of the sectors of the sets 110 and 120 is different from that of the sectors of the sets 150A and 150B, although different configurations are possible.

The total field generated at the center of the magnet is ~0.731 $\mu_0 M$, where $\mu_0 M$ represents the magnetization of the magnetized parts. The magnetic field at the center of the magnet 2B points essentially at the magic angle. The order of homogeneity of this magnet is 4 ($4^{th}$ order longitudinally and $4^{th}$ order transversely).

Figure 23:
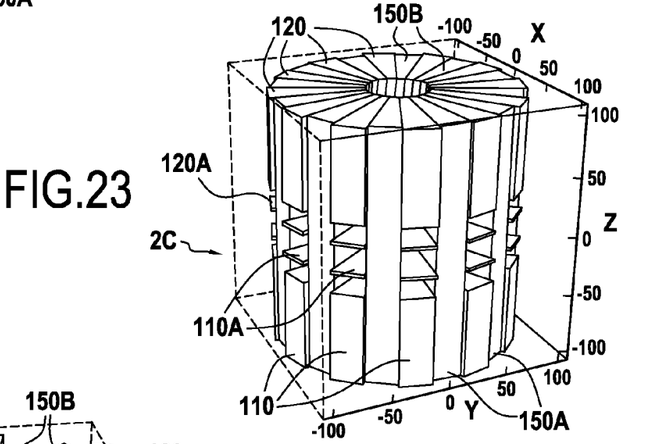
FIG. 23 is a perspective view of a magnetized structure of another embodiment of the invention comprising a stack of hybrid magnetized rings, each formed by sectors of trapezoidal section with a subdivision into slices along the longitudinal axis.

The example of a magnet 2C with a highly homogeneous inclined field shown in FIG. 23 uses sectors like those from FIGS. 8B, 9B, 12B to make hybrid rings. The sectors of the sets 120, 120A have radial magnetization toward the central hole in the magnet (see FIG. 9B), the sectors of the sets 110, 110A have radial magnetization toward the exterior surface of the magnet (see FIG. 8B), and the sectors of the sets 150A, 150B have magnetization of orientation that varies as in Halbach dipoles (see FIG. 12B).

There is no gap between the different sectors, but the sectors firstly of the sets 150A and 150B alternate with the sectors secondly of the sets 110, 110A and 120, 120A. The FIG. 23 configuration is distinguished from that of FIG. 22 essentially by the fact that the sectors firstly of the sets 110, 110A and secondly of the sets 120, 120A are divided into slices along the axis z, with thinner slices 110A, 120A in the median part of the magnet and a symmetrical configuration of the sets 110, 110A and 120, 120A relative to a plane perpendicular to the axis $\underline{z}$.

The total field generated at the center of the magnet is ~0.732 $\mu_0 M$, where $\mu_0 M$ represents the magnetization of the magnetized parts. The magnetic field points essentially at the magic angle. The order of homogeneity of this magnet is 6 ($6^{th}$ order longitudinally and $6^{th}$ order transversely).

Figure 24:
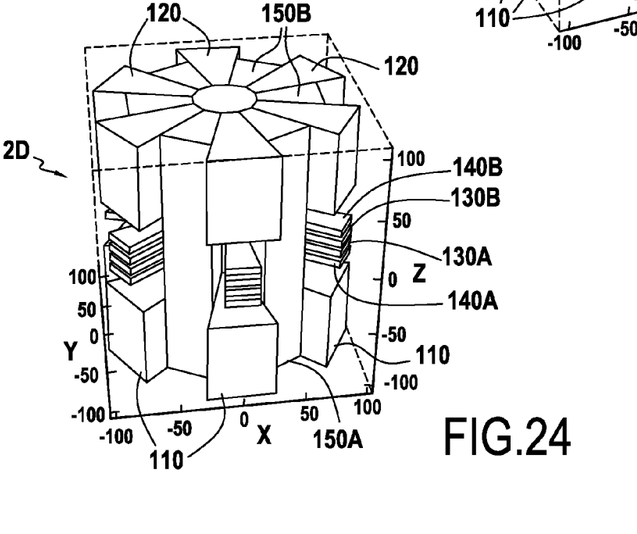
FIG. 24 is a perspective view of a magnetized structure of another embodiment of the invention comprising a stack of hybrid magnetized rings, each formed by sectors of trapezoidal section with interposed additional median rings with longitudinal parallel and antiparallel magnetization.

The example of a magnet 2D with inclined field shown in FIG. 24, which is highly homogeneous, uses sectors like those from FIGS. 8B, 9B, 10B, 11B, 12B to make hybrid rings. The sectors of the set 120 have a radial magnetization distribution toward the central hole in the magnet (see FIG. 9B), the sectors of the set 110 have radial magnetization toward the exterior surface of the magnet (see FIG. 8B), and the sectors of the sets 150A, 150B have a magnetization distribution of orientation that varies as in Halbach dipoles (see FIG. 12B).

Note also, staggered along the axis $\underline{z}$ between the sets of sectors 110 and 120 and between the sectors of the sets 150A, 150B, sectors of two sets 130A and 130B symmetrical relative to a plane perpendicular to the axis $\underline{z}$, these sectors having longitudinal magnetization parallel to the axis $\underline{z}$ (see FIG. 10B). Note similarly on either side of the sets 130, 130B sectors of two sets 140A and 140B symmetrical relative to a plane perpendicular to the axis $\underline{z}$, these sectors having longitudinal magnetization antiparallel to the axis $\underline{z}$ (see FIG. 11B). The sectors of the sets 130A, 130B, 140A, and 140B are preferably much thinner than the sectors of the sets 110, 120, 150A, and 150B.

The total field generated at the center of the magnet is ~0.7 $\mu_0 M$, where $\mu_0 M$ represents the magnetization of the magnetized parts. The magnetic field points essentially at the magic angle (although other orientations would naturally be possible, as for the other embodiments described). The order of homogeneity of the magnet 2D is 6 ($6^{th}$ order longitudinally and $6^{th}$ order transversely).

Figure 20:
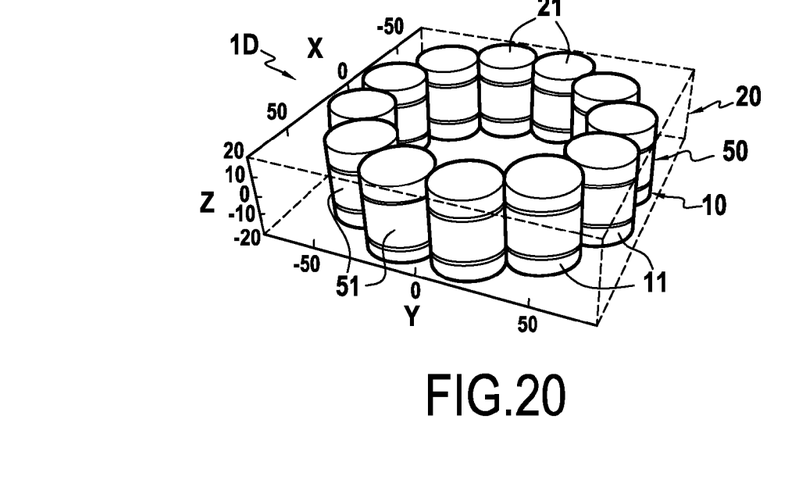
FIG. 20 is a perspective view of a magnetized structure of one embodiment of the invention comprising a stack of pure magnetized rings, each formed by contiguous cylindrical sectors.

The example of a magnet 1D with inclined field shown in FIG. 20 uses three pure rings 10, 50, 20, which here consist of respective cylinders 11, 51, 21. The ring 20 has a radial magnetization distribution toward the central hole in the magnet, the ring 10 has a radial magnetization distribution toward the exterior surface of the magnet, and the ring 50 has a magnetization distribution of orientation that varies as in Halbach rings. The incontestable advantage of this construction with cylindrical sectors is that they are all identical for a structure of the Halbach type, (see FIGS. 8C, 9C, 12C) with the additional possibility of adjusting the orientation of the magnetization in the final arrangement.

Figure 21:
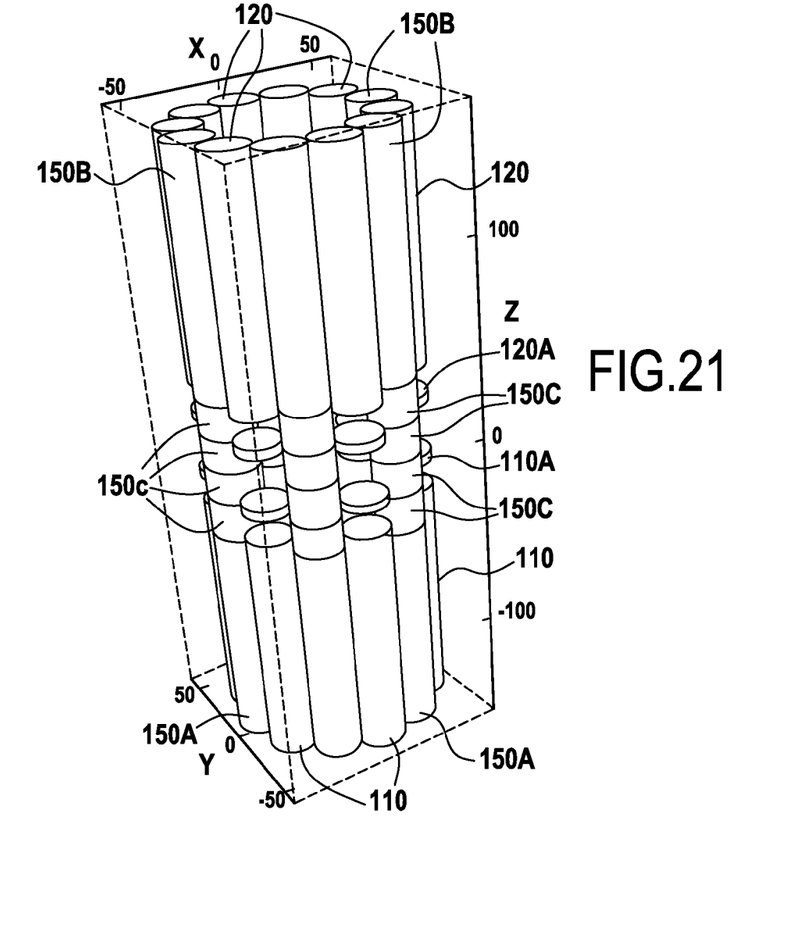
FIG. 21 is a perspective view of a magnetized structure of one embodiment of the invention comprising a stack of hybrid magnetized rings, each formed by cylindrical sectors.

The example of a magnet with inclined field shown in FIG. 21 uses alternating cylindrical sectors, like those from FIGS. 8C, 9C, 10C, 11C, 12C, to make hybrid rings. The sectors of the sets 120, 120A have a radial magnetization direction toward the hole in the magnet (see FIG. 9C), the sectors of the sets 110, 110A have a radial magnetization distribution toward the exterior surface of the magnet (see FIG. 8C), and the sectors of the sets 150A, 150B, and 150C have a magnetization distribution of orientation that varies as in Halbach dipoles.

As in the FIG. 23 embodiment, the sectors firstly of the sets 110, 110A and secondly of the sets 120, 120A are divided into slices along the axis $\underline{z}$ with thinner slices 110A, 120A in the median part of the magnet and a configuration of the sets 110, 110A and 120, 120A that is symmetrical relative to a plane perpendicular to the axis $\underline{z}$. There are no gaps between the different sectors, but the sectors firstly of the sets 150A and 150B alternate with the sectors secondly of the sets 110, 110A and 120, 120A. The sectors of the sets 110 and 120 are responsible for producing the longitudinal component of the magnetic field, while the sectors of the sets 150A, 150B are interleaved with the sectors of the respective sets 110 and 120 form hybrid rings that produce the transverse component. Note that a gap may be provided in the axial direction between the sectors of the sets 110, 110A and the sectors of the sets 120, 120A whereas the sectors of the sets 150A, 150B, and 150C are contiguous along the axis $\underline{z}$.

The total field generated at the center of the magnet is ~0.229 $\mu_0 M$, where $\mu_0 M$ represents the magnetization of the magnetized parts. In this example, the magnetic field points at 59 degrees. The order of homogeneity of this magnet is 6 ($6^{th}$ order longitudinally and $6^{th}$ order transversely).

Diverse modifications and additions are possible without departing from the scope of the invention. In particular, the different embodiments described may be combined with each other. Moreover, structures have been referred to having a magnetization distribution of orientation that varies as in Halbach dipoles, in order to produce an inclination of the magnetic field. The invention takes equally into account as equivalents other dipole magnetization distributions liable to produce the same inclination of the field, for example the structures described in U.S. Pat. No. 4,999,600.

The invention claimed is:

1. A magnetized structure applied to a nuclear magnetic resonance device that induces in a central area of interest a homogeneous magnetic field of predetermined orientation relative to a longitudinal axis of the structure, the structure comprising at least first and second magnetized rings disposed symmetrically relative to a plane that is perpendicular to said longitudinal axis and that contains said central area of interest, and at least one median annular magnetized structure disposed at least partly between the first and second magnetized rings and also disposed symmetrically relative to said plane, the first magnetized ring being magnetized radially relative to the longitudinal axis with divergent magnetization, the second magnetized ring being magnetized radially relative to the longitudinal axis with convergent magnetization, and the median annular magnetized structure being magnetized with an orientation different from that of the magnetization of the first and second magnetized rings, the magnetized structure being characterized in that the median annular magnetized structure comprises at least one magnetized ring having a magnetization distribution of orientation that varies as in Halbach dipoles, and in that the first and second magnetized rings and the median annular magnetized structure are each divided into individual components in the form of regularly distributed identical sectors.

2. A magnetized structure according to claim 1, characterized in that the first and second magnetized rings and the median annular magnetized structure constitute rings, each of which is divided into individual components in the form of regularly distributed identical sectors having the same magnetization distribution.

3. A magnetized structure according to claim 2, characterized in that the first and second magnetized rings and the median annular magnetized structure are contiguous along the longitudinal axis.

4. A magnetized structure according to claim 3, characterized in that there are at least twelve individual components in the form of regularly distributed identical sectors constituting a ring for each of the first and second magnetized rings and for the median annular magnetized structure in each ring.

5. A magnetized structure according to claim 4, characterized in that the median annular structure between the first and second magnetized rings further comprises at least two magnetized rings symmetrical relative to said plane perpendicular to the longitudinal axis and having magnetization with an axial orientation parallel to said longitudinal axis in the positive direction of said longitudinal axis.

6. A magnetized structure according to claim 5, characterized in that the median annular structure lying between the first and second magnetized rings further comprises at least two magnetized rings symmetrical relative to said plane perpendicular to the longitudinal axis and having magnetization with an axial orientation antiparallel to said longitudinal axis.

7. A magnetized structure according to claim 6, characterized in that all the individual components constituting a ring have a section consisting of a cylindrical ring sector, a section of trapezoidal shape, or a section of disk shape.

8. A magnetized structure according to claim 7, characterized in that the assembly of the individual components of the first and second magnetized rings and of the median annular magnetized structure is adapted to create at the center of said central area of interest a homogeneous induced magnetic field that essentially points at the magic angle of 54.7° relative to said longitudinal axis.

9. A magnetized structure according to claim 2, characterized in that there are at least twelve individual components in the form of regularly distributed identical sectors constituting a ring for each of the first and second magnetized rings and for the median annular magnetized structure in each ring.

10. A magnetized structure according to claim 9, characterized in that the median annular structure between the first and second magnetized rings further comprises at least two magnetized rings symmetrical relative to said plane perpendicular to the longitudinal axis and having magnetization with an axial orientation parallel to said longitudinal axis in the positive direction of said longitudinal axis.

11. A magnetized structure according to claim 10, characterized in that the median annular structure lying between the first and second magnetized rings further comprises at least two magnetized rings symmetrical relative to said plane perpendicular to the longitudinal axis and having magnetization with an axial orientation antiparallel to said longitudinal axis.

12. A magnetized structure according to claim 11, characterized in that all the individual components constituting a ring have a section consisting of a cylindrical ring sector, a section of trapezoidal shape, or a section of disk shape.

13. A magnetized structure according to claim 12, characterized in that the assembly of the individual components of the first and second magnetized rings and of the median annular magnetized structure is adapted to create at the center of said central area of interest a homogeneous induced magnetic field that essentially points at the magic angle of 54.7° relative to said longitudinal axis.

14. A magnetized structure according to claim 1, characterized in that the median annular structure between the first and second magnetized rings further comprises at least two magnetized rings symmetrical relative to said plane perpendicular to the longitudinal axis and having magnetization with an axial orientation parallel to said longitudinal axis in the positive direction of said longitudinal axis.

15. A magnetized structure according to claim 5, characterized in that the individual components forming magnetized rings symmetrical relative to said plane perpendicular to the longitudinal axis and having magnetization with axial orientation parallel or antiparallel to said longitudinal axis are interleaved with the individual components of the magnetized ring having a magnetization distribution of orientation that varies as in Halbach dipoles.

16. A magnetized structure according to claim 15, characterized in that the individual components of the first and second magnetized rings are interleaved in the azimuth direction alternately with the individual components of the magnetized ring having a magnetization distribution of orientation that varies as in Halbach dipoles.

17. A magnetized structure according to claim 1, characterized in that the median annular structure lying between the first and second magnetized rings further comprises at least two magnetized rings symmetrical relative to said plane perpendicular to the longitudinal axis and having magnetization with an axial orientation antiparallel to said longitudinal axis.

18. A magnetized structure according to claim 17, characterized in that the individual components forming magnetized rings symmetrical relative to said plane perpendicular to the longitudinal axis and having magnetization with axial orientation parallel or antiparallel to said longitudinal axis are interleaved with the individual components of the magnetized ring having a magnetization distribution of orientation that varies as in Halbach dipoles.

19. A magnetized structure according to claim 1, characterized in that all the individual components constituting a ring have a section consisting of a cylindrical ring sector, a section of trapezoidal shape, or a section of disk shape.

20. A magnetized structure according to claim 1, characterized in that the first and second magnetized rings and the median annular magnetized structure constitute rings, each divided into individual components in the form of regularly distributed identical sectors, the individual components of the magnetized ring having a magnetization distribution of orientation that varies as in Halbach dipoles being at least in part interleaved with the individual components of the first and second magnetized rings.

21. A magnetized structure according to claim 20, characterized in that the first and second magnetized rings constituting rings, each divided into individual components in the form of regularly distributed identical sectors are divided into slices along the longitudinal axis, at least one of the slices situated the closest to said plane of symmetry perpendicular to said longitudinal axis being thinner than the other slices.

22. A magnetized structure according to claim 21, characterized in that the individual components of the first and second magnetized rings are interleaved in the azimuth direction alternately with the individual components of the magnetized ring having a magnetization distribution of orientation that varies as in Halbach dipoles.

23. A magnetized structure according to claim 20, characterized in that the individual components of the first and second magnetized rings are interleaved in the azimuth direction alternately with the individual components of the magnetized ring having a magnetization distribution of orientation that varies as in Halbach dipoles.

24. A magnetized structure according to claim 20, characterized in that the individual components forming magnetized rings symmetrical relative to said plane perpendicular to the longitudinal axis and having magnetization with axial orientation parallel or antiparallel to said longitudinal axis are interleaved with the individual components of the magnetized ring having a magnetization distribution of orientation that varies as in Halbach dipoles.

25. A magnetized structure according to claim 1, characterized in that the assembly of the individual components of the first and second magnetized rings and of the median annular magnetized structure is adapted to create at the center of said central area of interest a homogeneous induced magnetic field that essentially points at the magic angle of 54.7° relative to said longitudinal axis.

\* \* \* \* \*